United States Patent
Veerasamy

(10) Patent No.: US 9,418,770 B2
(45) Date of Patent: Aug. 16, 2016

(54) LARGE AREA DEPOSITION AND DOPING OF GRAPHENE, AND PRODUCTS INCLUDING THE SAME

(71) Applicant: Guardian Industries Corp., Auburn Hills, MI (US)

(72) Inventor: Vijayen S. Veerasamy, Ann Arbor, MI (US)

(73) Assignee: Guardian Industries Corp., Auburn Hills, MI (US)

( * ) Notice: Subject to any disclaimer, the term of this patent is extended or adjusted under 35 U.S.C. 154(b) by 11 days.

(21) Appl. No.: 13/942,726

(22) Filed: Jul. 16, 2013

(65) Prior Publication Data

US 2013/0309475 A1 Nov. 21, 2013

Related U.S. Application Data

(62) Division of application No. 12/461,343, filed on Aug. 7, 2009, now Pat. No. 8,507,797.

(51) Int. Cl.
*H01B 1/04* (2006.01)
*C30B 29/02* (2006.01)
(Continued)

(52) U.S. Cl.
CPC . *H01B 1/04* (2013.01); *B82Y 30/00* (2013.01); *B82Y 40/00* (2013.01); *C01B 31/0461* (2013.01); *C30B 29/02* (2013.01); *C30B 31/02* (2013.01); *C30B 31/04* (2013.01); *C30B 31/22* (2013.01)

(58) Field of Classification Search
CPC ........ C30B 29/02; C30B 31/02; C30B 31/04; C30B 31/22; B82Y 40/00; B82Y 30/00; H01B 1/04; C01B 31/0461

USPC .......................................... 423/448; 428/220
See application file for complete search history.

(56) References Cited

U.S. PATENT DOCUMENTS

| 5,227,038 A | 7/1993 | Smalley et al. |
| 5,300,203 A | 4/1994 | Smalley |

(Continued)

FOREIGN PATENT DOCUMENTS

| CA | 2283502 | 9/1998 |
| CN | 101 289 181 | 9/2010 |

(Continued)

OTHER PUBLICATIONS

U.S. Appl. No. 12/461,343, filed Aug. 7, 2009; Veerasamy.

(Continued)

*Primary Examiner* — Daniel C McCracken
(74) *Attorney, Agent, or Firm* — Nixon & Vanderhye P.C.

(57) ABSTRACT

Certain example embodiments of this invention relate to the use of graphene as a transparent conductive coating (TCC). In certain example embodiments, graphene thin films grown on large areas hetero-epitaxially, e.g., on a catalyst thin film, from a hydrocarbon gas (such as, for example, $C_2H_2$, $CH_4$, or the like). The graphene thin films of certain example embodiments may be doped or undoped. In certain example embodiments, graphene thin films, once formed, may be lifted off of their carrier substrates and transferred to receiving substrates, e.g., for inclusion in an intermediate or final product. Graphene grown, lifted, and transferred in this way may exhibit low sheet resistances (e.g., less than 150 ohms/square and lower when doped) and high transmission values (e.g., at least in the visible and infrared spectra).

5 Claims, 10 Drawing Sheets

(51) Int. Cl.
  *C30B 31/02* (2006.01)
  *C30B 31/04* (2006.01)
  *C30B 31/22* (2006.01)
  *C01B 31/04* (2006.01)
  *B82Y 30/00* (2011.01)
  *B82Y 40/00* (2011.01)

(56) References Cited

U.S. PATENT DOCUMENTS

| | | |
|---|---|---|
| 5,556,517 A | 9/1996 | Smalley |
| 5,591,312 A | 1/1997 | Smalley |
| 5,650,597 A | 7/1997 | Redmayne |
| 5,739,376 A | 4/1998 | Bingel |
| 6,123,824 A | 9/2000 | Sano et al. |
| 6,129,901 A | 10/2000 | Moskovits et al. |
| 6,162,926 A | 12/2000 | Murphy et al. |
| 6,177,918 B1 | 1/2001 | Colgan et al. |
| 6,183,714 B1 | 2/2001 | Smalley et al. |
| 6,204,897 B1 | 3/2001 | Colgan et al. |
| 6,288,325 B1 | 9/2001 | Jansen et al. |
| 6,399,785 B1 | 6/2002 | Murphy et al. |
| 6,448,412 B1 | 9/2002 | Murphy et al. |
| 6,538,153 B1 | 3/2003 | Hirsch et al. |
| 6,602,371 B2 | 8/2003 | Veerasamy et al. |
| 6,613,603 B1 | 9/2003 | Sano |
| 6,645,455 B2 | 11/2003 | Margrave et al. |
| RE38,358 E | 12/2003 | Petrmichl |
| 6,683,783 B1 | 1/2004 | Smalley et al. |
| 6,692,717 B1 | 2/2004 | Smalley et al. |
| 6,749,827 B2 | 6/2004 | Smalley et al. |
| 6,752,977 B2 | 6/2004 | Smalley et al. |
| 6,756,025 B2 | 6/2004 | Colbert et al. |
| 6,756,026 B2 | 6/2004 | Colbert et al. |
| 6,761,870 B1 | 7/2004 | Smalley et al. |
| 6,784,361 B2 | 8/2004 | Carlson et al. |
| 6,790,425 B1 | 9/2004 | Smalley et al. |
| 6,808,606 B2 | 10/2004 | Thomsen et al. |
| 6,824,755 B2 | 11/2004 | Colbert et al. |
| 6,827,918 B2 | 12/2004 | Margrave et al. |
| 6,835,366 B1 | 12/2004 | Margrave et al. |
| 6,841,139 B2 | 1/2005 | Margrave et al. |
| 6,852,410 B2 | 2/2005 | Veedu et al. |
| 6,863,942 B2 | 3/2005 | Ren et al. |
| 6,875,412 B2 | 4/2005 | Margrave et al. |
| 6,890,506 B1 | 5/2005 | Harutyunyan et al. |
| 6,899,945 B2 | 5/2005 | Smalley et al. |
| 6,900,264 B2 | 5/2005 | Kumar et al. |
| 6,913,789 B2 | 7/2005 | Smalley et al. |
| 6,936,233 B2 | 8/2005 | Smalley et al. |
| 6,936,653 B2 | 8/2005 | McElrath et al. |
| 6,939,525 B2 | 9/2005 | Colbert et al. |
| 6,949,237 B2 | 9/2005 | Smalley et al. |
| 6,969,504 B2 | 11/2005 | Smalley et al. |
| 6,979,709 B2 | 12/2005 | Smalley et al. |
| 6,986,876 B2 | 1/2006 | Smalley et al. |
| 7,008,563 B2 | 3/2006 | Smalley et al. |
| 7,008,604 B2 | 3/2006 | Smalley et al. |
| 7,014,737 B2 | 3/2006 | Harutyunyan et al. |
| 7,029,646 B2 | 4/2006 | Margrave et al. |
| 7,041,620 B2 | 5/2006 | Smalley et al. |
| 7,048,903 B2 | 5/2006 | Colbert et al. |
| 7,048,999 B2 | 5/2006 | Smalley et al. |
| 7,052,666 B2 | 5/2006 | Colbert et al. |
| 7,052,668 B2 | 5/2006 | Smalley et al. |
| 7,061,749 B2 | 6/2006 | Liu et al. |
| 7,067,098 B2 | 6/2006 | Colbert et al. |
| 7,070,754 B2 | 7/2006 | Smalley et al. |
| 7,070,810 B2 | 7/2006 | Hirsch et al. |
| 7,071,406 B2 | 7/2006 | Smalley et al. |
| 7,074,310 B2 | 7/2006 | Smalley et al. |
| 7,087,207 B2 | 8/2006 | Smalley et al. |
| 7,090,819 B2 | 8/2006 | Smalley et al. |
| 7,097,820 B2 | 8/2006 | Colbert et al. |
| 7,105,596 B2 | 9/2006 | Smalley et al. |
| 7,108,841 B2 | 9/2006 | Smalley et al. |
| 7,109,581 B2 | 9/2006 | Dangelo et al. |
| 7,115,864 B2 | 10/2006 | Colbert et al. |
| 7,125,502 B2 | 10/2006 | Smalley et al. |
| 7,125,534 B1 | 10/2006 | Smalley et al. |
| 7,135,160 B2 | 11/2006 | Yang et al. |
| 7,138,100 B2 | 11/2006 | Smalley et al. |
| 7,150,864 B1 | 12/2006 | Smalley et al. |
| 7,163,956 B2 | 1/2007 | Wilson et al. |
| 7,192,642 B2 | 3/2007 | Veedu et al. |
| 7,195,780 B2 | 3/2007 | Dennis et al. |
| 7,201,887 B2 | 4/2007 | Smalley et al. |
| 7,204,970 B2 | 4/2007 | Smalley et al. |
| 7,205,069 B2 | 4/2007 | Smalley et al. |
| 7,211,795 B2 | 5/2007 | Collier et al. |
| 7,215,331 B2 | 5/2007 | Song et al. |
| 7,220,818 B2 | 5/2007 | Stoddart et al. |
| 7,250,148 B2 | 7/2007 | Yang et al. |
| 7,264,876 B2 | 9/2007 | Smalley et al. |
| 7,265,174 B2 | 9/2007 | Carroll et al. |
| 7,273,095 B2 | 9/2007 | Li et al. |
| 7,279,916 B2 | 10/2007 | Suhir |
| 7,338,648 B2 | 3/2008 | Harutyunyan et al. |
| 7,338,915 B1 | 3/2008 | Smalley et al. |
| 7,354,563 B2 | 4/2008 | Smalley et al. |
| 7,357,906 B2 | 4/2008 | Colbert et al. |
| 7,372,510 B2 | 5/2008 | Abileah |
| 7,390,477 B2 | 6/2008 | Smalley et al. |
| 7,390,767 B2 | 6/2008 | Smalley et al. |
| 7,436,393 B2 | 10/2008 | Hong et al. |
| 8,507,797 B2 | 8/2013 | Veerasamy |
| 8,535,553 B2 | 9/2013 | Kong et al. |
| 2008/0169021 A1 | 7/2008 | Krasnov |
| 2008/0199702 A1 | 8/2008 | Murphy et al. |
| 2008/0308147 A1 | 12/2008 | Lu et al. |
| 2009/0020157 A1 | 1/2009 | Krasnov et al. |
| 2009/0032098 A1 | 2/2009 | Lu |
| 2009/0068471 A1 | 3/2009 | Choi et al. |
| 2009/0110627 A1 | 4/2009 | Choi et al. |
| 2009/0155561 A1 | 6/2009 | Choi et al. |
| 2010/0102292 A1* | 4/2010 | Hiura et al. .............. 257/9 |
| 2013/0171452 A1* | 7/2013 | Goela et al. .............. 428/408 |

FOREIGN PATENT DOCUMENTS

| | | |
|---|---|---|
| EP | 0854839 | 7/1998 |
| EP | 1015384 | 7/2000 |
| EP | 1115655 | 7/2001 |
| EP | 1404908 | 4/2004 |
| EP | 1623437 | 2/2006 |
| JP | 10-178195 | 6/1998 |
| JP | 2001-1520615 | 10/2001 |
| JP | 2005-520021 | 7/2005 |
| JP | 2006-272491 | 10/2006 |
| JP | 2006-278586 | 10/2006 |
| JP | 2008-205272 | 9/2008 |
| JP | 2009-038064 | 2/2009 |
| JP | 2009-107921 | 5/2009 |
| JP | 2009-143799 | 7/2009 |
| JP | 2009-182173 | 8/2009 |
| KR | 1020010080933 | 8/2001 |
| TW | 471183 | 1/2001 |
| WO | WO 97/09272 | 3/1997 |
| WO | WO 98/39250 | 9/1998 |
| WO | WO 99/49525 | 9/1999 |
| WO | WO 00/17102 | 3/2000 |
| WO | WO 03/004741 | 1/2003 |
| WO | WO 03/078317 | 9/2003 |
| WO | WO 2004/097853 | 11/2004 |
| WO | WO 2005/084172 | 9/2005 |
| WO | WO 2008/108383 | * 9/2008 ............ H01L 29/786 |
| WO | WO 2008/128726 | 10/2008 |
| WO | WO 2009/049375 | 4/2009 |
| WO | WO 2009/085224 | 7/2009 |

OTHER PUBLICATIONS

Erik Jonas Järvholm, "Mechanisms and Development of Etch Resistance for Highly Aromatic Monomolecular Etch Masks—Towards

(56) References Cited

OTHER PUBLICATIONS

Molecular Lithography," Ph.D. Dissertation at the Georgia Institute of Technology, May 2007.

Lileta Gherghel et al., "Pyrolysis in the Mesophase: A Chemist's Approach toward Preparing Carbon Nano- and Microparticles," J. Am. Chem. Soc., vol. 124, pp. 13130-13138, Mar. 2002.

Yanyu Liang et al., "Transparent, Highly Conductive Graphene Electrodes from Acetylene-Assisted Thermolysis of Graphite Oxide Sheets and Nanograph Molecules," Nanotechnology, vol. 20: 434007, Received May 2009, Published Oct. 2009.

Kim et al., Large-Scale Pattern Growth of Graphene Films for Stretchable Transparent Electrodes, Nature 2009; 457; 706-710.

Veerasamy, et al., Nitrogen Doping of Highly Tetrahedral Amorphous Carbon, Physical Review B 1993; 48(24); 17954-17959.

"Large-Scale Pattern Growth of Graphene Films for Stretchable Transparent Electrodes", Kim et al., Nature, Nature Publishing Group, vol. 457, No. 7230, Feb. 5, 2009, pp. 706-710.

"Molecular Dynamics Simulations of Ion-Irradiation Induced Deflection of 2D Graphene Films", Terdalkar et al., International Journal of Solids and Structures. vol. 45, No. 13, Jun. 30, 2008, pp. 3908-3917.

"Electrical Transport Characteristic of Carbon Nanotube after Mass-Separated Ultra-Low-Energy Oxygen Ion Beams Irradiation", Yamamoto et al., Applied Surface Science, May 30, 2006, vol. 252, No. 15, pp. 5579-5582.

"Carbon Nano-Structures Containing Nitrogen and Hydrogen Prepared by Ion Beam Assisted Deposition", Paredez et al., Journal of Non-Crystalline Solids, Jun. 15, 2006, vol. 352, No. 9-20, pp. 1303-1306.

"Charged-Impurity Scattering in Graphene", Chen et al., Nature Physics, Apr. 2008, vol. 4, No. 13, pp. 377-381.

"Transparent and Flexible Carbon Nanotube/Polyaniline pH Sensors", Kaempgen et al., Journal of Electroanalytical Chemistry 586 (2006), pp. 72-76.

"High-Conductivity Polymer Nanocomposites Obtained by Tailoring the Characteristics of Carbon Nanotube Fillers", Grossiord et al., Advanced Functional Materials (2008), pp. 3226-3234.

Manuscript "Detection of Rain Using Capacitive Field Imaging", Veerasamy, Guardian Industries Corp., pp. 1-18.

"Applications of Carbon Nanotubes in the Twenty-First Century", Endo et al., The Royal Society (2004), pp. 2223-2238.

"How do Carbon Nanotubes Fit into the Semiconductor Roadmap", Graham et al., Applied Physics A (2005), pp. 1141-1151.

"A Method of Printing Carbon Nanotube Thin Films", Zhou et al., 2006 American Institute of Physics.

"Carbon Nanotube Films for Transparent and Plastic Electronics", Gruner, Journal of Materials Chemistry (2006), pp. 3533-3539.

Veerasamy et al., "Nitrogen Doping of Highly Tetrahedral Amorphous Carbon," Physical Journal Review B, The American Physical Society; vol. 28, No. 4, 1993, pp. 17 954-17 959.

Veerasamy et al., "n-Type Doping of highly Tetrahedral Diamond-Like Amorphous Carbon," Journal of Condens. Matter, vol. 5, 1993, pp. L169-L174.

Veerasamy et al., "Properties of n-Type Tetrahedral Amorphous Carbon (ta-C)/p-Type Crystalline Silicon Heterojunction Diodes," IEEE Transactions on Electron Devices; vol. 42, No. 4, 1995, pp. 577-585.

Novoselov et al., "Electric Field Effect in Atomically Thin Carbon Films," Science, vol. 306, 2004, pp. 666-669.

Obraztsov et al., "Chemical Vapor Deposition of Thin Graphite Films of Nanometer Thickness," Carbon, vol. 45, 2007, pp. 2017-2021.

U.S. Appl. No. 12/457,006, filed May 28, 2009; Broadway et al.
U.S. Appl. No. 12/292,406, filed Nov. 18, 2008; Krasnov.
U.S. Appl. No. 12/285,374, filed Oct. 2, 2008; den Boer et al.
U.S. Appl. No. 12/285,890, filed Oct. 15, 2008; Thomsen et al.
U.S. Appl. No. 11/122,218, filed May 5, 2005; Thomsen et al.
U.S. Appl. No. 11/049,292, filed Feb. 3, 2005; Thomsen et al.

Veerasamy et al., "Nitrogen Doping of Highly Tetrahedral Amorphous Carbon," Physical Review B, vol. 48, No. 24, Dec. 1993, pp. 17 954-17 959.

Veerasamy et al., "N-Type Doping of Highly Tetrahedral Diamond-Like Amorphous Carbon," Journal of Physical Condensation Matter, No. 5, 1993, pp. L169-L174.

Veerasamy at al., "Properties of n-Type Tetrahedral Amorphous Carbon (ta-C)/p-Type Crystalline Silicon Heterojunction Diodes," IEEE Transaction on Electron Devices, vol. 42, No. 4, Apr. 1995, pp. 577-585.

Novoselov, K.S., "Electrical Field Effect in Atomically Thin Carbon Films," Science, vol. 306, (2004), pp. 666-669.

U.S. Appl. No. 12/285,374, Krasnov et al., filed Nov. 18, 2008.
U.S. Appl. No. 12/285,890, Thomsen et al., filed Oct. 15, 2008.
U.S. Appl. No. 12/457,006, Broadway et al., filed May 28, 2009.
U.S. Appl. No. 11/049,292, Thomsen et al., filed Feb. 3, 2005.
U.S. Appl. No. 11/122,218, Thomsen et al., filed May 5, 2005.
U.S. Appl. No. 12/292,406, Krasnov, filed Nov. 18, 2008.

"Large Area, Few-Layer Graphene Films on Arbitrary Substrates by Chemical Vapor Deposition", REINA, Nano Letters 2009, vol. 9, No. 1; pp. 30-35.

"Controllable N-Doping of Graphene"; Guo et al., 2010 American Chemical Society, pp. 4975-4980.

"A Mechanism for Carbon Nanosheet Formation"; Zhu et al., An International Carbon Journal (45) 2007; pp. 2229-2234.

2012-523594-JP Notice of Reasons for Refusal mailed Apr. 8, 2014.

Taiwan Search Report dated Feb. 11, 2015 for TW Application No. 99124522.

* cited by examiner

LARGE AREA DEPOSITION AND DOPING OF GRAPHENE, AND PRODUCTS INCLUDING THE SAME

This application is a divisional of application Ser. No. 12/461,343, filed Aug. 7, 2009, the entire disclosure of which is hereby incorporated herein by reference in this application.

FIELD OF THE INVENTION

Certain example embodiments of this invention relate to thin films comprising graphene. More particularly, certain example embodiments of this invention relate to the use of graphene as a transparent conductive coating (TCC). In certain example embodiments, graphene thin films grown on large areas hetero-epitaxially, e.g., on a catalyst thin film, from a hydrocarbon gas (such as, for example, $C_2H_2$, $CH_4$, or the like). The graphene thin films of certain example embodiments may be doped or undoped. In certain example embodiments, graphene thin films, once formed, may be lifted off of their carrier substrates and transferred to receiving substrates, e.g., for inclusion in an intermediate or final product.

BACKGROUND AND SUMMARY OF EXAMPLE EMBODIMENTS OF THE INVENTION

Indium tin oxide (ITO) and fluorine-doped tin oxide (FTO or SnO:F) coatings are widely used as window electrodes in opto-electronic devices. These transparent conductive oxides (TCOs) have been immensely successful in a variety of applications. Unfortunately, however, the use of ITO and FTO is becoming increasingly problematic for a number of reasons. Such problems include, for example, the fact that there is a limited amount of the element indium available on Earth, the instability of the TCOs in the presence of an acide or base, their susceptibility to ion diffusion from ion conducting layers, their limited transparency in the near infrared region (e.g., power-rich spectrum), high leakage current of FTO devices caused by FTO structure defects, etc. The brittle nature of ITO and its high deposition temperature can also limit its applications. In addition, surface asperities in SnO2:F may cause problematic arcing.

Thus, it will be appreciated that there is a need in the art for smooth and patternable electrode materials with good stability, high transparency, and excellent conductivity.

The search for novel electrode materials with good stability, high transparency, and excellent conductivity is ongoing. One aspect of this search involves identifying viable alternatives to such conventional TCOs. In this regard, the inventor of the instant invention has developed a viable transparent conductive coating (TCC) based on carbon, specifically graphene.

The term graphene generally refers to one or more atomic layers of graphite, e.g., with a single graphene layer or SGL being extendible up to n-layers of graphite (e.g., where n can be as high as about 10). Graphene's recent discovery and isolation (by cleaving crystalline graphite) at the University of Manchester comes at a time when the trend in electronics is to reduce the dimensions of the circuit elements to the nanometer scale. In this respect, graphene has unexpectedly led to a new world of unique opto-electronic properties, not encountered in standard electronic materials. This emerges from the linear dispersion relation (E vs. k), which gives rise to charge carriers in graphene having a zero rest mass and behaving like relativistic particles. The relativistic-like behavior delocalized electrons moving around carbon atoms results from their interaction with the periodic potential of graphene-'s honeycomb lattice gives rise to new quasi-particles that at low energies (E<1.2 eV) are accurately described by the (2+1)-dimensional Dirac equation with an effective speed of light $v_F \approx c/300 = 10^6$ ms$^{-1}$. Therefore, the well established techniques of quantum electrodynamics (QED) (which deals with photons) can be brought to bear in the study of graphene—with the further advantageous aspect being that such effects are amplified in graphene by a factor of 300. For example, the universal coupling constant α is nearly 2 in graphene compared to 1/137 in vacuum. See K. S. Novoselov, "Electrical Field Effect in Atomically Thin Carbon Films," *Science*, vol. 306, pp. 666-69 (2004), the contents of which are hereby incorporated herein.

Despite being only one-atom thick (at a minimum), graphene is chemically and thermally stable (although graphene may be surface-oxidized at 300 degrees C.), thereby allowing successfully fabricated graphene-based devices to withstand ambient conditions. High quality graphene sheets were first made by micro-mechanical cleavage of bulk graphite. The same technique is being fine-tuned to currently provide high-quality graphene crystallites up to 100 μm$^2$ in size. This size is sufficient for most research purposes in microelectronics. Consequently, most techniques developed so far, mainly at universities, have focused more on the microscopic sample, and device preparation and characterization rather than scaling up.

Unlike most of the current research trends, to realize the full potential of graphene as a possible TCC, large-area deposition of high quality material on substrates (e.g., glass or plastic substrates) is essential. To date, most large-scale graphene production processes rely on exfoliation of bulk graphite using wet-based chemicals and starts with highly ordered pyrolytic graphite (HOPG) and chemical exfoliation. As is known, HOPG is a highly ordered form of pyrolytic graphite with an angular spread of the c axes of less than 1 degree, and usually is produced by stress annealing at 3300 K. HOPG behaves much like a pure metal in that it is generally reflective and electrically conductive, although brittle and flaky. Graphene produced in this manner is filtered and then adhered to a surface. However, there are drawbacks with the exfoliation process. For example, exfoliated graphene tends to fold and become crumpled, exists as small strips and relies on a collage/stitch process for deposition, lacks inherent control on the number of graphene layers, etc. The material so produced is often contaminated by intercalates and, as such, has low grade electronic properties.

An in-depth analysis of the carbon phase diagram shows process window conditions suitable to produce not only graphite and diamond, but also other allotropic forms such as, for example, carbon nano-tubes (CNT). Catalytic deposition of nano-tubes is done from a gas phase at temperatures as high as 1000 degrees C. by a variety of groups.

In contrast with these conventional research areas and conventional techniques, certain example embodiments of this invention relate to a scalable technique to hetero-epitaxially grow mono-crystalline graphite (n as large as about 15) and convert it to high electronic grade (HEG) graphene (n<about 3). Certain example embodiments also relate to the use of HEG graphene in transparent (in terms of both visible and infrared spectra), conductive ultra-thin graphene films, e.g., as an alternative to the ubiquitously employed metal oxides window electrodes for a variety of applications (including, for example, solid-state solar cells). The growth technique of certain example embodiments is based on a catalytically driven hetero-epitaxial CVD process which takes place a temperature that is low enough to be glass-friendly. For example, thermodynamic as well as kinetics principles allow HEG graphene films to be crystallized from the gas phase on a seed catalyst layer at a temperature less than about 700 degrees C.

Certain example embodiments also use atomic hydrogen, which has been proven to be a potent radical for scavenging amorphous carbonaceous contamination on substrates and being able to do so at low process temperatures. It is also extremely good at removing oxides and other overlayers typically left by etching procedures.

Certain example embodiments of this invention relate to a method of making a doped graphene thin film. An intermediate graphene thin film is hetero-epitaxially grown on a catalyst thin film, with the catalyst thin film having a substantially single-orientation large-grain crystal structure. The intermediate graphene thin film is doped with n-type or p-type dopants in making the doped graphene thin film. The doped graphene thin film has a sheet resistance less than 150 ohms/square.

In certain example embodiments, the doping of the intermediate graphene thin film comprises exposing the intermediate graphene thin film to a doping gas comprising a material to be used as the dopant; exciting a plasma within a chamber containing the intermediate graphene thin film and the doping gas; and low energy ion beam implanting the dopant in the intermediate graphene thin film using the material in the doping gas.

In certain example embodiments, the doping of the intermediate graphene thin film comprises providing a target receiving substrate including solid-state dopants therein, with the target receiving substrate including dopants therein by virtue of a melting process used to fabricate the target receiving substrate; and allowing the solid-state dopants in the target receiving substrate to migrate into the intermediate graphene thin film by thermal diffusion.

In certain example embodiments, the doping of the intermediate graphene thin film comprises providing a target receiving substrate including solid-state dopants therein, with the target receiving substrate including dopants therein by virtue of ion beam implantation; and allowing the solid-state dopants in the target receiving substrate to migrate into the intermediate graphene thin film by thermal diffusion.

In certain example embodiments, the doping of the intermediate graphene thin film comprises providing a target receiving substrate having at least one thin film coating disposed thereon, with the thin film coating including solid-state dopants therein; and allowing the solid-state dopants in the at least one thin film formed on the target receiving substrate to migrate into the intermediate graphene thin film by thermal diffusion.

In certain example embodiments, the doping of the intermediate graphene thin film comprises pre-implanting solid state dopants in the catalyst thin film; and allowing the solid-state dopants in the catalyst thin film to migrate into the intermediate graphene thin film by thermal diffusion. The thermal diffusion may occur, for example, during the deposition of the intermediate graphene thin film.

Certain example embodiments of this invention relate to a doped graphene thin film hetero-epitaxially grown, directly or indirectly, on a metal catalyst thin film having a substantially single-orientation large-grain crystal structure. The graphene thin film is 1-10 atomic layers thick. The doped graphene thin film has a sheet resistance less than 150 ohms/square.

The doped graphene ($n>=2$) thin film may, in certain example embodiments, be doped with any one or more of: nitrogen, boron, phosphorous, fluorine, lithium, and potassium. The doped graphene thin film may, in certain example embodiments, have a sheet resistance of 10-20 ohms/square. The doped graphene thin films of certain example embodiments include n-type or p-type dopants.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

Certain example embodiments of this invention relate to a scalable technique to hetero-epitaxially grow mono-crystalline graphite (n as large as about 15) and convert it to high electronic grade (HEG) graphene (n<about 3). Certain example embodiments also relate to the use of HEG graphene in transparent (in terms of both visible and infrared spectra), conductive ultra-thin graphene films, e.g., as an alternative to the more ubiquitously employed metal oxides window electrodes for a variety of applications (including, for example, solid-state solar cells). The growth technique of certain example embodiments is based on a catalytically driven hetero-epitaxial CVD process which takes place a temperature that is low enough to be glass-friendly. For example, thermodynamic as well as kinetics principles allow HEG graphene films to be crystallized from the gas phase on a seed catalyst layer (e.g., at a temperature less than about 600 degrees C.).

Figure 1:
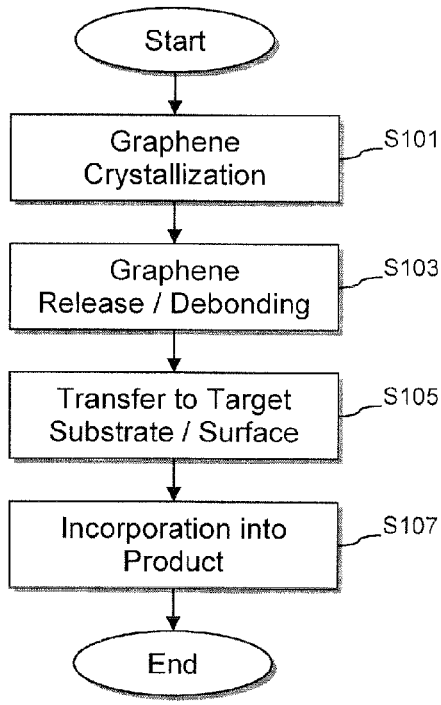
FIG. 1 is a high level flowchart illustrating the overall techniques of certain example embodiments.

FIG. 1 is a high level flowchart illustrating the overall techniques of certain example embodiments. As shown in FIG. 1, the overall techniques of certain example embodiments can be classified as belonging to one of four basic steps: graphene crystallization on a suitable back support (step S101), graphene release or debonding from the back support (step S103), graphene transference to the target substrate or surface (step S105), and incorporation of the target substrate or surface into a product (step S107). As explained in greater detail below, it will be appreciated that the product referred to in step S107 may be an intermediate product or a final product.

Example Graphene Crystallization Techniques

The graphene crystallization techniques of certain example embodiments may be thought of as involving "cracking" a hydrocarbon gas and re-assembling the carbon atoms into the familiar honeycomb structure over a large area (e.g., an area of about 1 meter, or larger), e.g., leveraging the surface catalytic pathway. The graphene crystallization techniques of certain example embodiments take place at high temperature and moderate pressures. Illustrative details of this example process will be described in detail below.

The catalytic growth techniques of certain example embodiments are somewhat related to the techniques that have been used to grow graphite over a hetero-epitaxial area. A catalyst for graphene crystallization is disposed on a suitable back support. The back support may be any suitable material capable of withstanding high heats (e.g., temperatures up to about 1000 degrees C.) such as, for example, certain ceramics or glass products, zirconium inclusive materials, aluminum nitride materials, silicon wafers, etc. A thin film is disposed, directly or indirectly, on the back support, thereby ensuring that its surface is substantially uncontaminated prior to the crystallization process. The inventor of the instant invention has discovered that graphene crystallization is facilitated when the catalyst layer has a substantially single-orientation crystal structure. In this regard, small grains have been determined to be less advantageous, since their mosaic structure ultimately will be transferred to the graphene layer. In any event, the particular orientation of the crystal structure has been found to be largely insignificant for graphene crystallization, provided that the catalyst layer, at least in substantial part, has a single-orientation crystal structure. Indeed, the comparative absence of (or low) grain boundaries in the catalyst has been found to result in the same or a similar orientation for the grown graphene, and has been found to provide for high electrical grade (HEG) graphene.

The catalyst layer itself may be disposed on the back support by any suitable technique such as, for example, sputtering, combustion vapor deposition (CVD), flame pyrolysis, etc. The catalyst layer itself may comprise any suitable metal or metal-inclusive material. For instance, the catalyst layer may comprise, for example, metals such as nickel, cobalt, iron, permalloy (e.g., nickel iron alloys, generally comprising about 20% iron and 80% nickel), alloys of nickel and chromium, copper, and combinations thereof. Of course, other metals may be used in connection with certain example embodiments. The inventor has discovered that catalyst layers of or including nickel are particular advantageous for graphene crystallization, and that alloys of nickel and chromium are yet more advantageous. Furthermore, the inventor has discovered that the amount of chromium in nickel-chromium layers (also sometimes called nichrome or NiCr layers) can be optimized so as to promote the formation of large crystals. In particular, 3-15% Cr in the NiCr layer is preferable, 5-12% Cr in the NiCr layer is more preferable, and 7-10% of Cr in the NiCr layer is still more preferable. The presence of vanadium in the metal thin film also has been found to be advantageous to promote large crystal growth. The catalyst layer may be relatively thin or thick. For example, the thin film may be 50-1000 nm thick, more preferably 75-750 nm thick, and still more preferably 100-500 nm thick. A "large crystal growth" may in certain example instances include crystals having a length along a major axis on the order of 10 s of microns, and sometimes even larger.

Once the catalyst thin film is disposed on the back support, a hydrocarbon gas (e.g., $C_2H_2$ gas, $CH_4$ gas, etc.) is introduced in a chamber in which the back support with the catalyst thin film disposed thereon is located. The hydrocarbon gas may be introduced at a pressure ranging from about 5-150 mTorr, more preferably 10-100 mTorr. In general, the higher the pressure, the faster the growth of the graphene. The back support and/or the chamber as a whole is/are then heated to dissolve or "crack open" the hydrocarbon gas. For example, the back support may be raised to a temperature in the range of 600-1200 degrees C., more preferably 700-1000 degrees C., and still more preferably 800-900 degrees C. The heating may be accomplished by any suitable technique such as, for example, via a short wave infrared (IR) heater. The heating may take place in an environment comprising a gas such as argon, nitrogen, a mix of nitrogen and hydrogen, or other suitable environment. In other words, the heating of the hydrocarbon gas may take place in an environment comprising other gasses in certain example embodiments. In certain example embodiments, it may be desirable to use a pure hydrocarbon gas (for example, with $C_2H_2$), whereas it may be desirable to use a mix of hydrocarbon gas an another inert or other gas (for example, $CH_4$ mixed with Ar).

Figure 2:
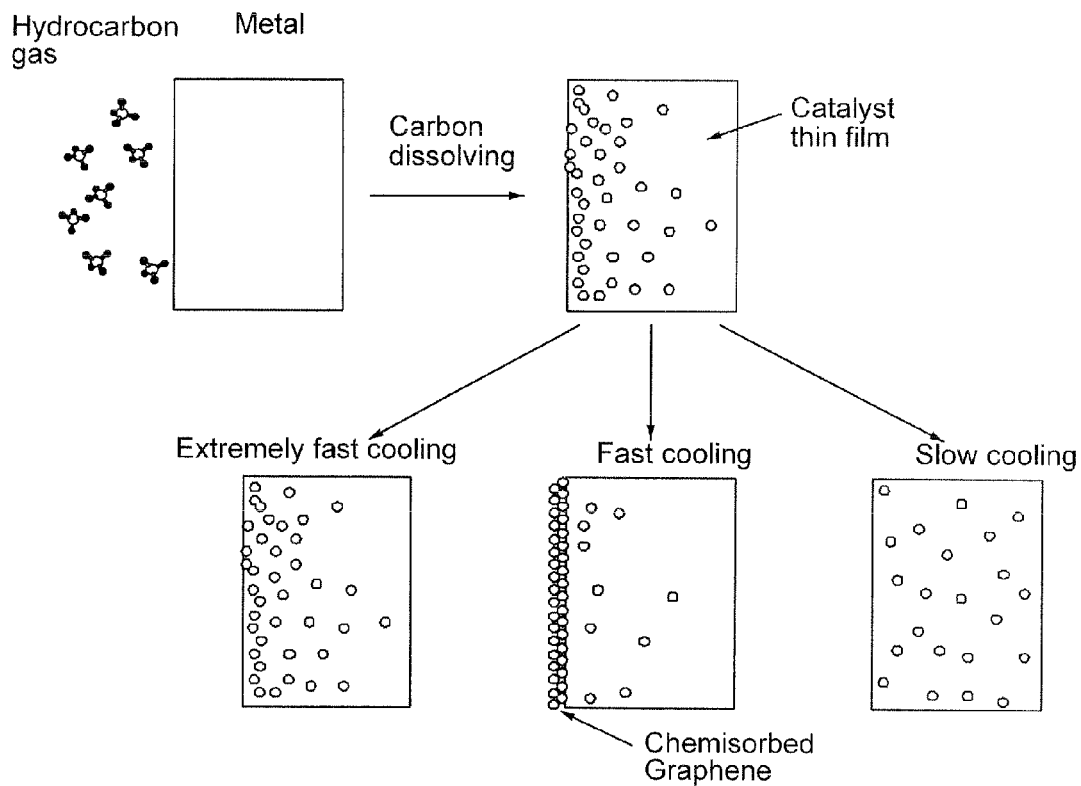
FIG. 2 is an example schematic view of the catalytic growth techniques of certain example embodiments, illustrating the introduction of the hydrocarbon gas, the carbon dissolving, and the possible results of quenching, in accordance with certain example embodiments.

The graphene will grow in this or another suitable environment. To stop the growth and to help ensure that the graphene is grown on the surface of the catalyst (e.g., as opposed to being embedded within the catalyst), certain example embodiments employ a quenching process. The quenching may be performed using an inert gas such as, for example, argon, nitrogen, combinations thereof, etc. To promote graphene growth on the surface of the catalyst layer, the quenching should be performed fairly quickly. More particularly, it has been found that quenching too fast or too slow results in poor or no graphene growth on the surface of the catalyst layer. Generally, quenching so as to reduce the temperature of the back support and/or substrate from about 900 degrees C. to 700 degrees (or lower) over the course of several minutes has been found to promote good graphene growth, e.g., via chemisorption. In this regard, FIG. 2 is an example schematic view of the catalytic growth techniques of certain example embodiments, illustrating the introduction of the hydrocarbon gas, the carbon dissolving, and the possible results of quenching, in accordance with certain example embodiments.

The growth process of graphene imposes the strict film thickness relation t=n×SLG, where n involves some discrete number of steps. Identifying very rapidly if graphene has been produced and determining the value of n over the film area is roughly equivalent to measuring film quality and uniformity in one single measurement. Although graphene sheets can be seen by atomic force and scanning electron microscopy, these techniques are time consuming and can also lead to contamination of the graphene. Therefore, certain example embodiments employ a phase contrast technique that enhances the visibility of graphene on the intended catalyst surfaces. This may be done with a view to mapping any variation in n-value over the deposition surface on the metallic catalyst film. The technique relies on the fact that the contrast of graphene may be enhanced substantially by spin coating a material onto it. For example, a widely used UV curable resist (e.g., PMMA) may be spin coated, screen printed, gravure coated, or otherwise disposed on the graphene/metal/back support, e.g., at a thickness sufficient to make the film visible and continuous (e.g., around 1 micron thick). As explained in greater detail below, the inclusion of a polymer resist also may facilitate the lift-off process of the graphene prior to its transfer to the final surface. That is, in addition to providing an indication as to when graphene formation is complete, the polymer resist also may provide a support for the highly elastic graphene when the metal layer is released or otherwise debonded from the back support as explained in detail below.

In the event that a layer is grown too thick (either intentionally or unintentionally), the layer can be etched down, for example, using hydrogen atoms (H*). This technique may be advantageous in a number of example situations. For instance, where growth occurs too quickly, unexpectedly, unevenly, etc., H* can be used to correct such problems. As another example, to ensure that enough graphene is grown, graphite may be created, graphane may be deposited, and the graphane may be selectively etched back to the desired n-level HEG graphene, e.g., using H*. As still another example, H* can be used to selectively etch away graphene, e.g., to create conductive areas and non-conductive areas. This may be accomplished by applying an appropriate mask, performing the etching, and then removing the mask, for example.

Theoretical studies of graphene has shown that the mobility of carriers can be higher than 200,000 cm$^2$/(V·s). Experimental measurements of gas phase treated hetero-epitaxial grown graphene show resistivity as low as $3 \times 10^{-6}$ Ω-cm, which is better than that of silver thin films. The sheet resistance for such graphene layers has been found to be about 150 ohms/square. One factor that may vary is the number of layers of graphene that are needed to give the lowest resistivity and sheet resistance, and it will be appreciated that the desired thickness of the graphene may vary depending on the target application. In general, graphene suitable for most applications may be n=1-15 graphene, more preferably n=1-10 graphene, still more preferably n=1-5 graphene, and sometimes n=2-3 graphene. An n=1 graphene layer has been found to result in a transmission drop of about 2.3-2.6%. This reduction in transmission has been found to be generally linear across substantially all spectra, e.g., ranging from ultraviolet (UV), through visible, and through IR. Furthermore, the loss in transmission has been found to be substantially linear with each successive incrementation of n.

Example Doping Techniques

Although a sheet resistance of 150 ohms/square may be suitable for certain example applications, it will be appreciated that a further reduction in sheet resistance may be desirable for different example applications. For example, it will be appreciated that a sheet resistance of 10-20 ohms/square may be desirable for certain example applications. The inventor of the instant invention has determined that sheet resistance can be lowered via the doping of the graphene.

In this regard, being only one atomic layer thick, graphene exhibits ballistic transport on a submicron scale and can be doped heavily—either by gate voltages or molecular adsorbates or intercalates in the case where n≥2—without significant loss of mobility. It has been determined by the inventor of the instant invention that that in graphene, aside from the donor/acceptor distinction, there are in general two different classes of dopants, namely, paramagnetic and nonmagnetic. In contrast to ordinary semiconductors, the latter type of impurities act generally as rather weak dopants, whereas the paramagnetic impurities cause strong doping; Because of the linearly vanishing, electron-hole symmetric density of states (DOS) near the Dirac point of graphene, localized impurity states without spin polarization are pinned to the center of the pseudo-gap. Thus, impurity states in graphene distinguish strongly from their counterparts in usual semiconductors, where the DOS in the valence and conduction bands are very different and impurity levels lie generally far away from the middle of the gap. Although one might not expect a strong doping effect which requires existence of well-defined donor (or acceptor) levels several tenths of electron volt away from the Fermi level, if the impurity has a local magnetic moment, its energy levels split more or less symmetrically by the Hund exchange, of the order of 1 eV, which provides a favorable situation for a strong doping impurity effects on the electronic structure of two-dimensional systems with Dirac-like spectrum such as those present in graphene. This line of reasoning may be used to guide the choice of molecules that form both paramagnetic single molecules and diamagnetic dimers systems to dope graphene and enhance its conductivity from $10^3$ S/cm to $10^5$ S/cm, and sometimes even to $10^6$ S/cm.

Example dopants suitable for use in connection with certain example embodiments include nitrogen, boron, phosphorous, fluorides, lithium, potassium, ammonium, etc. Sulfur-based dopants (e.g., sulfur dioxide) also may be used in connection with certain example embodiments. For example, sulfides present in glass substrates may be caused to seep out of the glass and thus dope the graphene-based layer. Several example graphene doping techniques are set forth in greater detail below.

Figure 3:
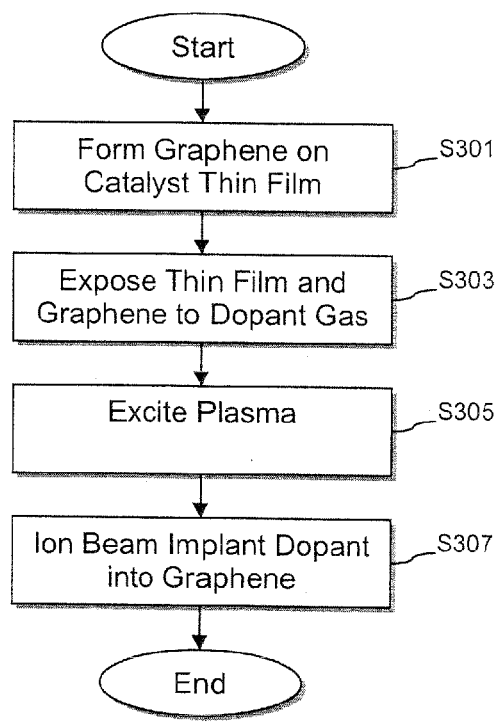
FIG. 3 is a flowchart illustrating a first example technique for doping graphene in accordance with certain example embodiments.

FIG. 3 is a flowchart illustrating a first example technique for doping graphene in accordance with certain example embodiments. The FIG. 3 example technique essentially involves ion beam implanting the doping material in the graphene. In this example technique, graphene is grown on a metal catalyst (step S301), e.g., as described above. The catalyst with the graphene formed thereon is exposed to a gas comprising a material to be used as the dopant (also sometimes referred to as a dopant gas) (step S303). A plasma is then excited within a chamber containing the catalyst with the graphene formed thereon and the dopant gas (S305). An ion beam is then used to implant the dopant into the graphene (S307). Example ion beam techniques suitable for this sort of doping are disclosed in, for example, U.S. Pat. Nos. 6,602, 371; 6,808,606; and Re. 38,358, and U.S. Publication No. 2008/0199702, each of which is hereby incorporated herein by reference. The ion beam power may be about 10-200 ev, more preferably 20-50 ev, still more preferably 20-40 ev.

Figure 4:
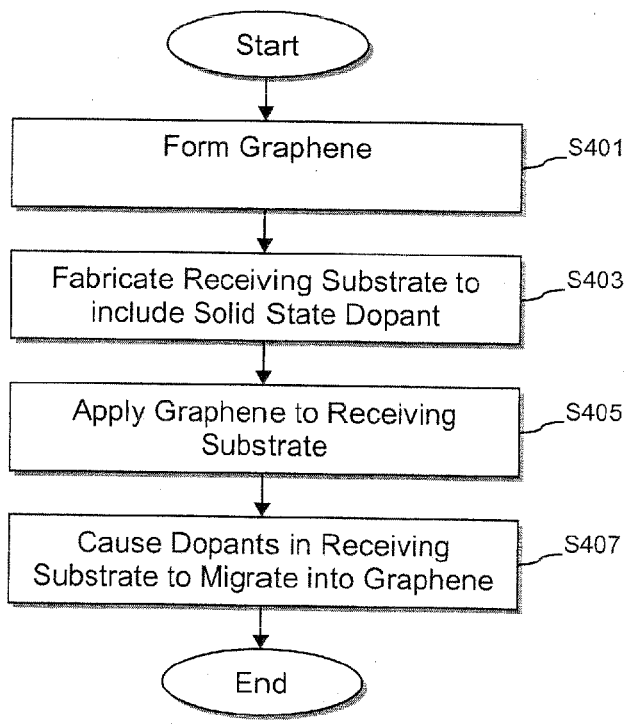
FIG. 4 is a flowchart illustrating a second example technique for doping graphene in accordance with certain example embodiments.

FIG. 4 is a flowchart illustrating a second example technique for doping graphene in accordance with certain example embodiments. The FIG. 4 example technique essentially involves pre-implanting solid state dopants in the target receiving substrate, and then causing those solid state dopants to migrate into the graphene when the graphene is applied to the receiving substrate. In this example technique, graphene is grown on a metal catalyst (step S401), e.g., as described above. The receiving substrate is pre-fabricated so as to include solid-state dopants therein (step S403). For example, the solid-state dopants may be included via the melting in the formulation in the glass. About 1-10 atomic %, more preferably 1-5 atomic %, and still more preferably 2-3 atomic % dopant may be included in the glass melt. The graphene is applied to the receiving substrate, e.g., using one of the example techniques described in detail below (step S405). Then, the solid-state dopants in the receiving substrate are caused to migrate into the graphene. The heat used in the deposition of the graphene will cause the dopants to migrate towards the graphene layer being formed. Similarly, additionally doped films can be included on the glass and the dopants therein can be caused to migrate through these layers by thermal diffusion, for example, creating a doped graphene (n>=2) layer.

An ion beam also can be used to implant the dopants directly in the glass in certain example embodiments. The ion beam power may be about 10-1000 ev, more preferably 20-500 ev, still more preferably 20-100 ev. When an intermediate layer is doped and used to provide impurities for the graphene, the ion beam may operate at about 10-200 ev, more preferably 20-50 ev, still more preferably 20-40 ev.

Figure 5:
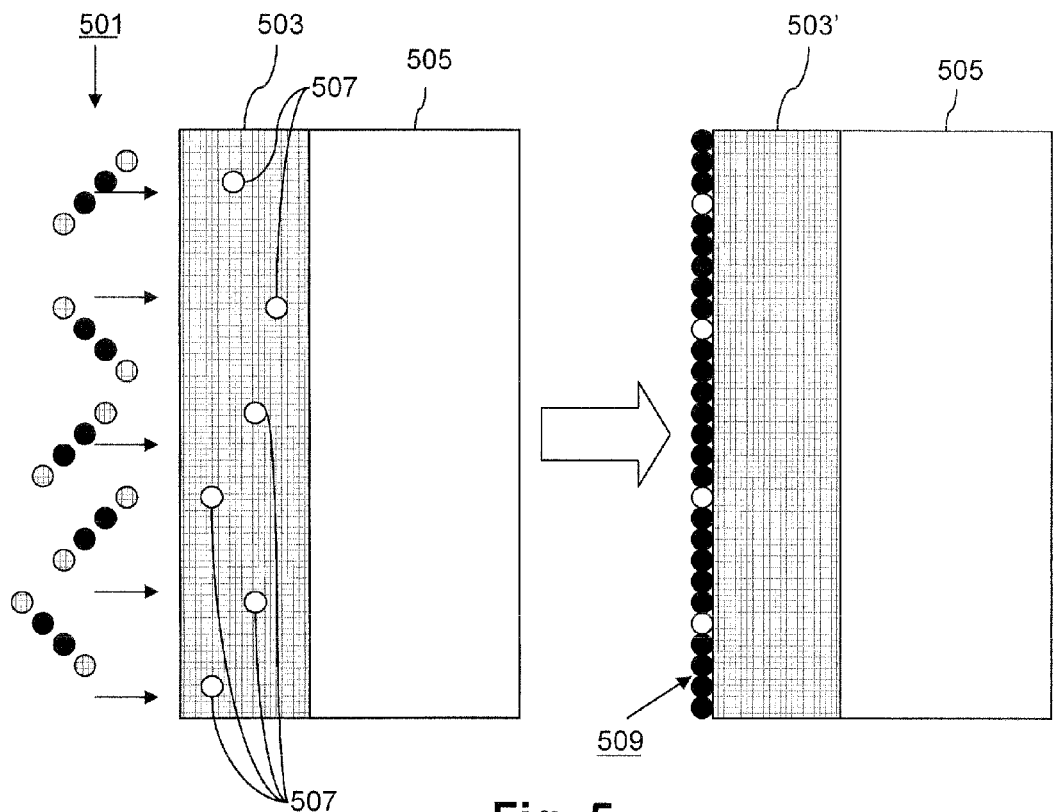
FIG. 5 is an example schematic view illustrating a third example technique for doping graphene in accordance with certain example embodiments.

FIG. 5 is an example schematic view illustrating a third example technique for doping graphene in accordance with certain example embodiments. The FIG. 5 example techniques essentially involves pre-implanting solid state dopants 507 in the metal catalyst layer 503, and then causing those solid state dopants 507 to migrate through the catalyst layer 503 as the graphene is being formed, thereby creating a doped graphene 509 on the surface of the catalyst layer 503. More particularly, in this example technique, the catalyst layer 503 is disposed on the back support 505. The catalyst layer 503 includes solid-state dopants 507 therein. In other words, the catalyst has solid-state dopant atoms inside its bulk (e.g., from about 1-10%, more preferably about 1-5%, and most preferably about 1-3%). Hydrocarbon gas 501 is introduced proximate to the catalyst layer 503 formed, at a high temperature. The solid-state dopants 507 in the catalyst layer 503 are caused to migrate towards the outer surface thereof, e.g., by this high temperature, as the graphene crystallization takes place. The rate at which the dopants arrive at the surface has been found to be a function of the catalyst thickness and temperature. The crystallization is stopped via quenching and, ultimately, a doped graphene 509 is formed on the surface of the catalyst layer 503'. Following the formation of the doped graphene 509, the catalyst layer 503' now has fewer (or no) solid-state dopants 507 located therein. One advantage of this example technique relates to the potential to control the ultrathin film growth by judiciously varying the metal surface temperature, partial pressure, and residence time of the deposition gas species, as well as the reactive radicals used in quenching rate process.

It will be appreciated that these example doping techniques may be used alone and/or in various combinations and sub-combinations with one another and/or further techniques. It also will be appreciated that certain example embodiments may include a single dopant material or multiple dopant materials, e.g., by using a particular example technique once, a particular technique repeatedly, or through a combination of multiple techniques one or more times each. For example, p-type and n-type dopants are possible in certain example embodiments.

Figure 6:
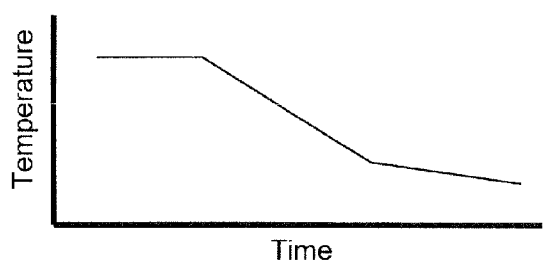
FIG. 6 is a graph plotting temperature vs. time involved in the doping of graphene in accordance with certain example embodiments.

FIG. 6 is a graph plotting temperature vs. time involved in the doping of graphene in accordance with certain example embodiments. As indicated above, the cooling may be accomplished using, for example, an inert gas. In general, and also as indicated above, the high temperature may be about 900 degrees C. in certain example embodiments, and the low temperature may be about 700 degrees C., and the cooling may take place over several minutes. The same heating/cooling profile as that shown in FIG. 6 may be used regardless of whether the graphene is doped.

Example Graphene Release/Debonding and Transfer Techniques

Figure 7:
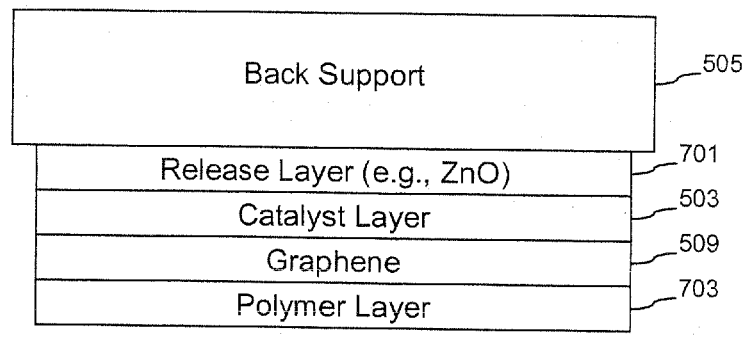
FIG. 7 is an example layer stack useful in the graphene release or debonding techniques of certain example embodiments.

Once graphene has been hetero-epitaxially grown, it may be released or debonded from the metal catalyst and/or the back support, e.g., prior to being placed on substrate to be incorporated into the intermediate or final product. Various procedures may be implemented for lifting epitaxial films from their growth substrates in accordance with certain example embodiments. FIG. 7 is an example layer stack useful in the graphene release or debonding techniques of certain example embodiments. Referred to FIG. 7, in certain example embodiments, an optional release layer 701 may be provided between the back support 505 and the catalyst layer 503. This release layer 701 may be of or include, for example, zinc oxide (e.g., ZnO or other suitable stoichiometry). Post-graphene deposition, the graphene 509/metal catalyst layer 503/release layer 701 stack coated substrate 505 may receive a thick overcoat (e.g., several microns thick) layer of polymer 703, e.g., applied via spin coating, dispensed by a meniscus flow, etc., which may be cured. As alluded to above, this polymer layer 703 may act as a backbone or support for the graphene 509 during lift-off and/or debonding, keeping the extremely flexible graphene film continuous, while also reducing the likelihood of the graphene film curling up, creasing, or otherwise deforming.

Also as alluded to above, PMMA may be used as the polymer that allows the graphene to become visible by phase contrast and for support prior to and/or during lift-off. However, a broad range of polymers whose mechanical and chemical properties can be matched to those of graphene may be used during the support phase, as well as the release transfer phase in connection with certain example embodiments. The work for lift-off may be performed in parallel with the main epitaxial growth branch, e.g., by experimenting with graphene films that can be chemically exfoliated from graphite.

The release layer may be chemically induced to de-bond the graphene/metal from mother substrate once the polymer layer disposed thereon. For example, in the case of a zinc oxide release layer, washing in vinegar may trigger the release of the graphene. The use of a zinc oxide release layer also is advantageous, inasmuch as the inventor of the instant invention has discovered that the metal catalyst layer also is removed from the graphene with the release layer. It is believed that this is a result of the texturing caused by the zinc oxide release layer together with its inter-linkages formed with the grains in the catalyst layer. It will be appreciated that this reduces (and sometimes even eliminates) the need to later remove the catalyst layer.

Certain lift-off/debonding and transfer techniques essentially regard the original substrate as a reusable epitaxial growth substrate. As such, a selective etching to undercut and dissolve away the metallic catalyst thin film away from the epitaxially grown (with polymer on top) graphene may be desirable in such example embodiments. Thus, the catalyst layer may be etched off, regardless of whether a release layer is used, in certain example embodiments. Suitable etchants include, for example, acids such as hydrochloric acid, phosphoric acid, etc.

The final recipient glass substrate surface may be prepared so as to receive the graphene layer. For example, a Langmuir Blodgett film (e.g., from a Langmuir-Blodgett acid) may be applied to the glass substrate. The final recipient substrate alternatively or additionally may be coated with a smooth graphenophillic layer such as, for example, a silicone-based polymer, etc., making the latter receptive to the graphene. This may help to ensure electrostatic bonding, thus preferentially allowing the transfer of the graphene during transfer. The target substrate may additionally or alternatively be exposed to UV radiation, e.g., to increase the surface energy of the target substrate and thus make it more receptive to the graphene.

Figure 8:
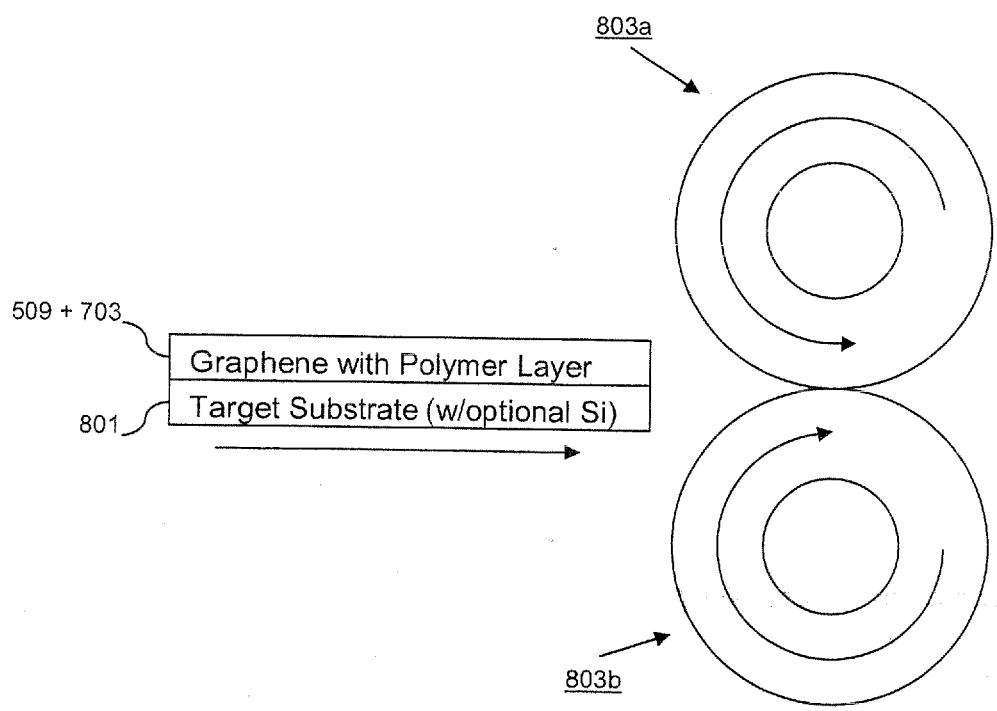
FIG. 8 is an example schematic view of a lamination apparatus that may be used to dispose the graphene on the target glass substrate in accordance with certain example embodiments.

The graphene may be applied to the substrate via blanket stamping and/or rolling in certain example embodiments. Such processes allow the graphene previously grown and chemisorbed onto the metal carrier to be transferred onto the recipient glass by contact pressure. As one example, the graphene may be applied to the substrate via one or more lamination rollers, e.g., as shown in FIG. 8. In this regard, FIG. 8 shows upper and lower rollers 803a and 803b, which will apply pressure and cause the graphene 509 and polymer layer 703 to be laminated to the target substrate 801. As noted above, the target substrate 801 have a silicon-inclusive or other graphenophillic layer disposed thereon to facilitate the lamination. It will be appreciated that the polymer layer 703 will be applied as the outermost layer and that the graphene 509 will be closer to (or even directly on) the target substrate 801. In certain example embodiments, one or more layers may be provided on the substrate prior to the application of the graphene.

Once the graphene is disposed on the target substrate, the polymer layer may be removed. In certain example embodiments, the polymer may be dissolved using an appropriate solvent. When a photosensitive material such as PMMA is used, it may be removed via UV light exposure. Of course, other removal techniques also are possible.

It will be appreciated that the catalyst thin film may be etched off after the graphene has been applied to the target substrate in certain example embodiments, e.g., using one of the example etchants described above. The choice of etchant also may be based on the presence or absence of any layers underlying the graphene.

Certain example embodiments more directly electrochemically anodize the metal catalyst thin film below the graphene. In such example embodiments, the graphene itself may act as the cathode, as the metal below is anodized into a transparent oxide while still being bonded to the original substrate. Such example embodiments may be used to bypass the use of the polymer overcoat by essentially performing the lift-off and transfer processes in one step. However, anodization by electrochemical means may affect the electronic properties of the graphene and thus may need to be compensated for. In certain example embodiments, the catalyst layer below the graphene may be oxidized in other ways to make it transparent. For example, a conductive oxide may be used to "link" the graphene-based layer to a substrate, semiconductor, or other layer. In this regard, cobalt, chrome cobalt, nickel chrome cobalt, and/or the like may be oxidized. In certain example embodiments, this may also reduce the need for graphene lift-off, making the transfer, manipulation, and other handling of graphene easier.

The graphene also may be picked up using an adhesive or tape-like material in certain example embodiments. The adhesive may be positioned on the target substrate. The graphene may be transferred to the target substrate, e.g., following the application of pressure, by more strongly adhering to the substrate than to the tape, etc.

Example Reactor Design

Figure 9:
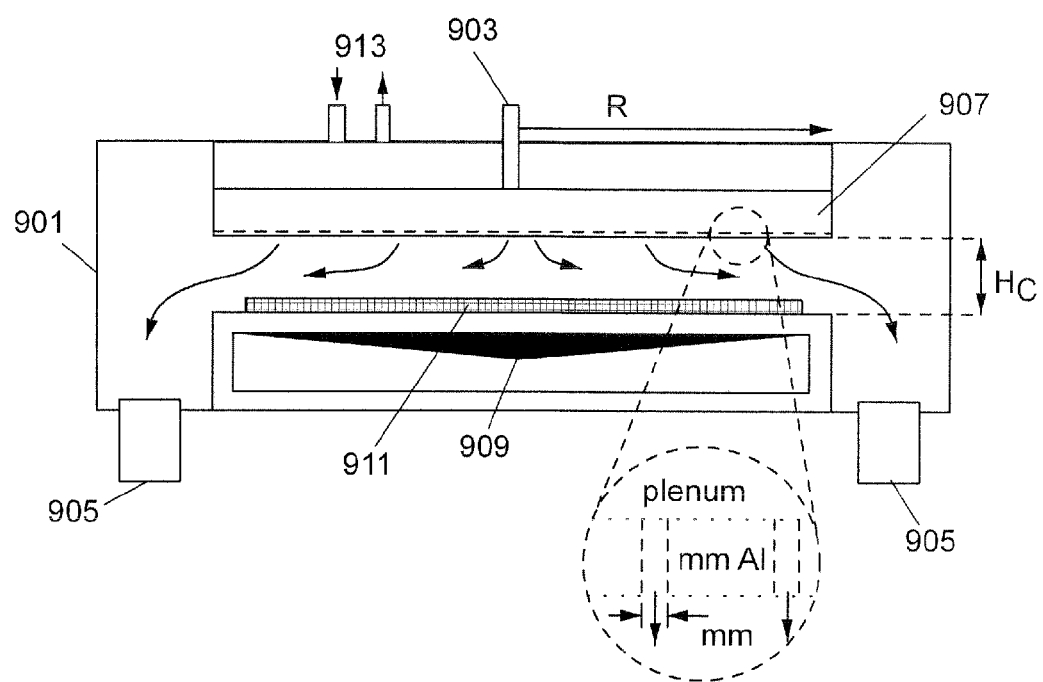
FIG. 9 is a cross-sectional schematic view of a reactor suitable for depositing high electronic grade (HEG) graphene in accordance with an example embodiment.

Showerhead reactors typically employ a perforated or porous planar surface to dispense reactant gasses more-or-less uniformly over a second parallel planar heated surface. Such a configuration may be used to grow graphene using the example hetero-epitaxial techniques described herein. Showerhead reactors also are advantageous for the processing of large square ultra-smooth glass or ceramic substrate. A basic schematic of a showerhead reactor is FIG. 9, with the plenum design being enlarged. In other words, FIG. 9 is a cross-sectional schematic view of a reactor suitable for depositing high electronic grade (HEG) graphene in accordance with an example embodiment. The reactor includes a body portion 901 with several inlets and outlets. More particularly, a gas inlet 903 is provided at the top and in the approximate horizontal center of the body portion 901 of the reactor. The gas inlet 903 may receive gas from one or more sources and thus may provide various gasses including, for example, the hydrocarbon gas, the gas(ses) used to form the environment during hetero-epitaxial growth, the quenching gas(ses), etc. The flow and flux of the gas will be described in greater detail below, e.g., with reference to the plenum design of the showerhead 907. A plurality of exhaust ports 905 may be provided at the bottom of the body portion 901 of the reactor. In the FIG. 9 example embodiment, two exhaust ports 905 are provided proximate to the extremes of the body portion 901 of the reactor, e.g., so as to draw out gas provided by the gas inlet 903 that generally will flow through substantially the entirety of the body portion 901. It will be appreciated that more or fewer exhaust ports 905 may be provided in certain example embodiments (e.g., further exhaust ports 905 may be provided in the approximate horizontal center of the body portion 901 of the reactor, at the top or sides of the body portion 901 of the reactor, etc.).

The back support substrate 909 may be cleaned and have the catalyst thin film disposed thereon (e.g., by physical vapor deposition or PVD, sputtering, CVD, flame pyrolysis, or the like) prior to entry into the reactor by a load-lock mechanism in certain example embodiments. In terms of susceptor design, the surface of the back support substrate 909 may be rapidly heated (e.g., using an RTA heater, a shortwave IR heater, or other suitable heater that is capable of inductively heating the substrate and/or layers thereon without necessarily also heating the entire chamber) to a controllable temperature level and uniformity that allows (i) the metal film to crystallize and activate, and (ii) the preferential deposition of graphene of substantially uniform and controllable thickness from a gas phase precursor on its surface. The heater may be controllable so as to account for the parameter deposition rate/(temperature*thickness) of catalyst ratio. The back support substrate 909 may move through the reactor in the direction R or may sit stationary under the showerhead 907. The showerhead 907 may be cooled, e.g., using a cooling fluid or gas introduced by one or more coolant inlets/outlets 913. In brief, and as shown in the FIG. 9 enlargement, the plenum design may include a plurality of apertures in the bottom of the showerhead 907, with each such aperture being only a few millimeters wide.

Changing the ceiling gap Hc, or the height between the bottom surface of the showerhead 907 and the top surface upon which the back support substrate 909 moves, may have several effects. For example, the chamber volume and thus the surface-to-volume ratio may be modified, thereby affecting the gas residence time, consumption time, and radial velocities. Changes in the residence time have been found to strongly influence the extent of gas phase reactions. A showerhead configuration operated as shown in FIG. 9 (with a hot surface below a cooled surface) has the potential for Benard variety natural convection if operated at high pressures (e.g., in the hundreds of Torr), and such a tendency is strongly influenced by the height through the Rayleigh number (a dimensionless number associated with buoyancy driven flow, also known as free convection or natural convection; when it exceeds a critical value for a fluid, heat transfer is primarily in the form of convection). Accordingly, the ceiling gap He may be varied through simple hardware changes, by providing adjustable mounting of the substrate electrode, etc., so as to affect the hetero-epitaxial growth of the graphene.

The FIG. 9 example embodiment is not necessarily intended to operate a plasma within the reactor. This is because the crystalline film growth mechanism is by hetero-epitaxy by surface sorption (generally occurring only on the catalyst). Growth from the plasma phase has been found to give rise to mostly amorphous films and also has been found to allow the formation of macro-particle or dust formation that can greatly reduce film quality and result in pinholes that would be detrimental for a one-to-ten atomic layer film. Instead, certain example embodiments may involve making graphite (e.g., monocrystalline graphite), etching it to graphane (e.g., of a certain n-value), and turning the graphane into graphene (e.g., into HEG graphene). Of course, an in-situ end-point technique may be implemented as a feed-back parameter.

In certain example embodiments, an ion beam source may be located in-line but external to the reactor of FIG. 9, e.g., to perform doping in accordance with the example techniques described above. However, in certain example embodiments, an ion beam source may be located within the body portion of a reactor.

Example Process Flow

Figure 10:
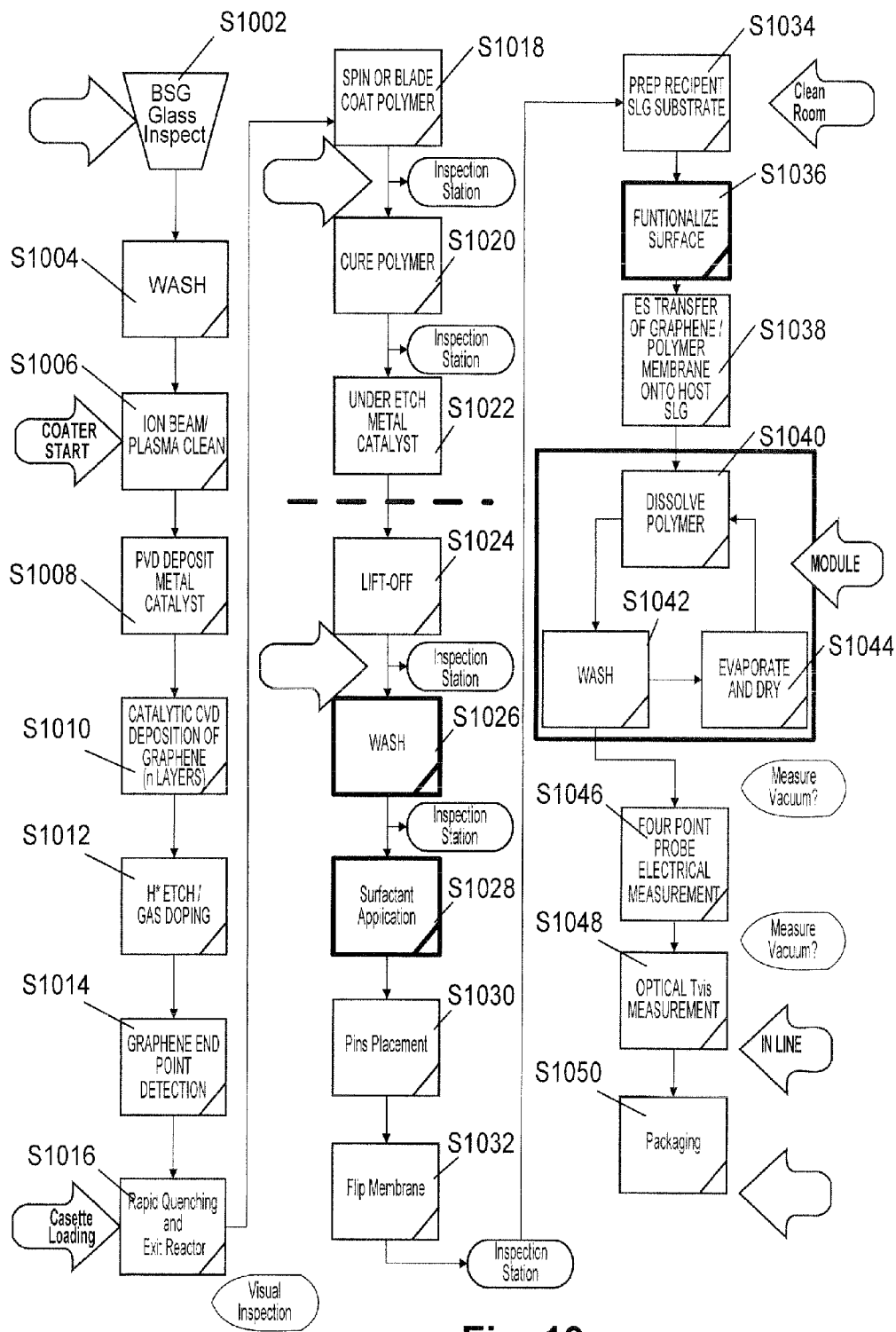
FIG. 10 is an example process flow that illustrates certain of the example catalytic CVD growth, lift-off, and transfer techniques of certain example embodiments.

FIG. 10 is an example process flow that illustrates certain of the example catalytic CVD growth, lift-off, and transfer techniques of certain example embodiments. The example process shown in FIG. 10 begins as the back support glass is inspected, e.g., using a conventional glass inspection method (step S1002) and washed (step S1004). The back support glass may then be cleaned using ion beam cleaning, plasma ashing, or the like (step S1006). The catalyst (e.g., a metal catalyst) is disposed on the back support, e.g., using PVD (step S1008). It is noted that the cleaning process of step S1006 may be accomplished within the graphene coater/reactor in certain example embodiments of this invention. In other words, the back support glass with or without the metal catalyst thin film formed thereon may be loaded into the graphene coater/reactor prior to step S1006 in certain example embodiments, e.g., depending on whether the metal catalyst layer is deposited within or prior to the coater/reactor. The catalytic deposition of an n-layer graphene may then take place (step S1010). The graphene may be etched down by introducing hydrogen atoms (H*) in certain example embodiments, and the graphene optionally may be doped, e.g., depending on the target application (step S1012). The end of the graphene formation is detected, e.g., by determining whether enough graphene has been deposited and/or whether the H* etching has been sufficient (step S1014). To stop the graphene formation, a rapid quenching process is used, and the back support glass with the graphene formed therein exits the reactor/coater (step S1016). Visual inspection optionally may be performed at this point.

Following graphene formation, a polymer useful in the transference of the graphene may be disposed on the graphene, e.g., by spin, blade, or other coating technique (step S1018). This product optionally may be inspected, e.g., to determine whether the requisite color change takes place. If it has, the polymer may be cured (e.g., using heat, UV radiation, etc.) (step S1020), and then inspected again. The metal catalyst may be under-etched or otherwise released (step S1022), e.g., to prepare the graphene for lift-off (step S1024).

Once lift-off has been achieved, the polymer and the graphene optionally may be inspected and then washed, e.g., to remove any remaining under-etchants and/or non-cured polymer (step S1026). Another optional inspection process may be performed at this point. A surfactant may be applied (step S1028), pins are placed at least into the polymer (step S1030), and the membrane is flipped (step S1032), e.g., with the aid of these pins. The lift-off process is now complete, and the graphene is now ready to be transferred to the recipient substrate.

The recipient substrate is prepared (step S1034), e.g., in a clean room. The surface of the recipient substrate may be functionalized, e.g., by exposing it to a UV light to increase its surface energy, to apply graphenophillic coatings thereto, etc. (step S1036). The graphene/polymer membrane may then be transferred onto the host substrate (step S1038).

Once the transfer is complete, the receiving substrate with the graphene and polymer attached thereto may be fed into a module to remove the polymer (step S1040). This may be done by exposing the polymer to UV light, heat, chemicals, etc. The substrate with the graphene and at least partially dissolved polymer may then be washed (step S1042), with any excess water or other materials evaporated and dried off (step S1044). This polymer removal process may be repeated, as necessary.

Following the removal of the polymer, the sheet resistance of the graphene on the substrate may be measured (step S1046), e.g., using a standard four-point probe. Optical transmission (e.g., Tvis, etc.) also may be measured (step S1048). Assuming that the intermediate or final products meet quality standards, they may be packaged (step S1050).

Figure 11:
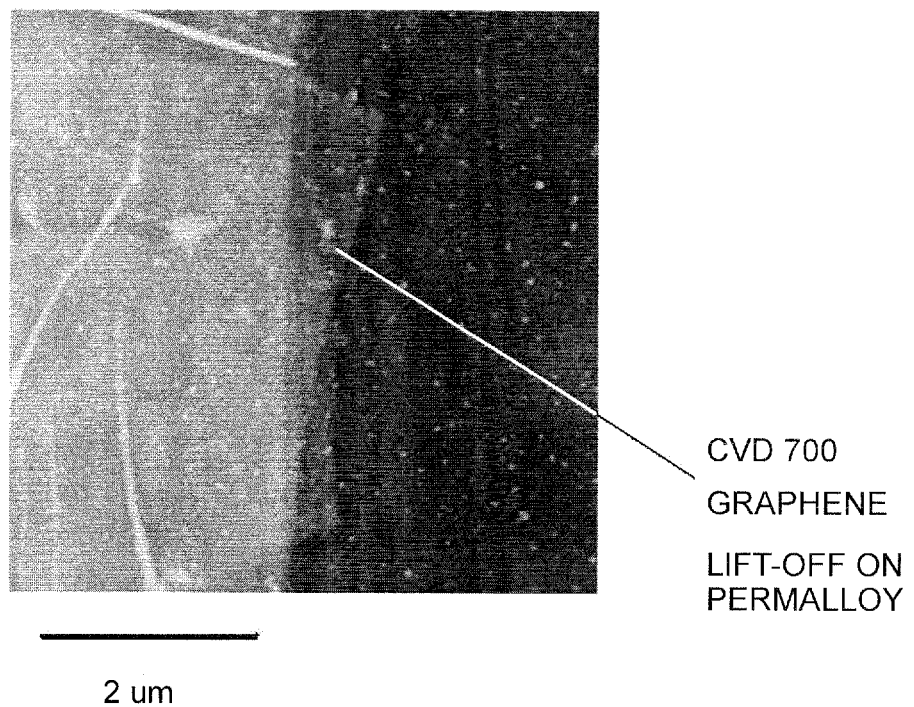
FIG. 11 is an image of a sample graphene produced according to certain example embodiments.

Using these techniques, sample films were prepared. The sample films exhibited high conductivity of 15500 S/cm and transparency of more than 80% over the 500-3000 nm wavelength. Furthermore, the films showed good chemical and thermal stability. FIG. 11 is an image of a sample graphene produced according to certain example embodiments. The FIG. 11 image highlights the lift-off of the hetero-epitaxially grown graphene from a permalloy thin film.

Example Graphene-Inclusive Applications

As alluded to above, graphene-based layers may be used in a wide variety of applications and/or electronic devices. In such example applications and/or electronic devices, ITO and/or other conductive layers simply may be replaced by graphene-based layers. Making devices with graphene will typically involve making contacts with metals, degenerate semiconductors like ITO, solar cell semiconductors such as a-Si and CdTe among others, and/or the like.

Despite having a zero band-gap and a vanishing density of states (DOS) at the K-points in the Brillouin zone, free standing graphene exhibits metallic behavior. However, adsorption on metallic, semiconducting or insulating substrate can alter its electronic properties. To compensate for this, additionally, or in the alternative, in example applications and/or electronic devices, the graphene-based layer may be doped in accordance with any semiconductor layers adjacent thereto. That is, in certain example embodiments, if a graphene-based layer is adjacent to an n-type semiconductor layer, the graphene-based layer may be doped with an n-type dopant. Likewise, in certain example embodiments, if a graphene-based layer is adjacent to a p-type semiconductor layer, the graphene-based layer may be doped with a p-type dopant. Of course, the shift in Fermi level in graphene with respect to the conical points may be modeled, e.g., using density functional theory (DFT). Band-gap calculations show that metal/graphene interfaces can be classified into two broad classes, namely, chemisorption and physisorption. In the latter case, a shift upward (downward) means that electron (holes) are donated by the metal to the graphene. Thus, it is possible to predict which metal or TCO to use to as contacts to the graphene depending on the application.

A first example electronic device that may make use of one or more graphene-based layers is a solar photovoltaic device. Such example devices may include front electrodes or back electrodes. In such devices, the graphene-based layers may simply replace the ITO typically used therein. Photovoltaic devices are disclosed in, for example, U.S. Pat. Nos. 6,784, 361, 6,288,325, 6,613,603 and 6,123,824; U.S. Publication Nos. 2008/0169021; 2009/0032098; 2008/0308147; and 2009/0020157; and application Ser. Nos. 12/285,374, 12/285,890, and 12/457,006, the disclosures of which are hereby incorporated herein by reference.

Figure 12:
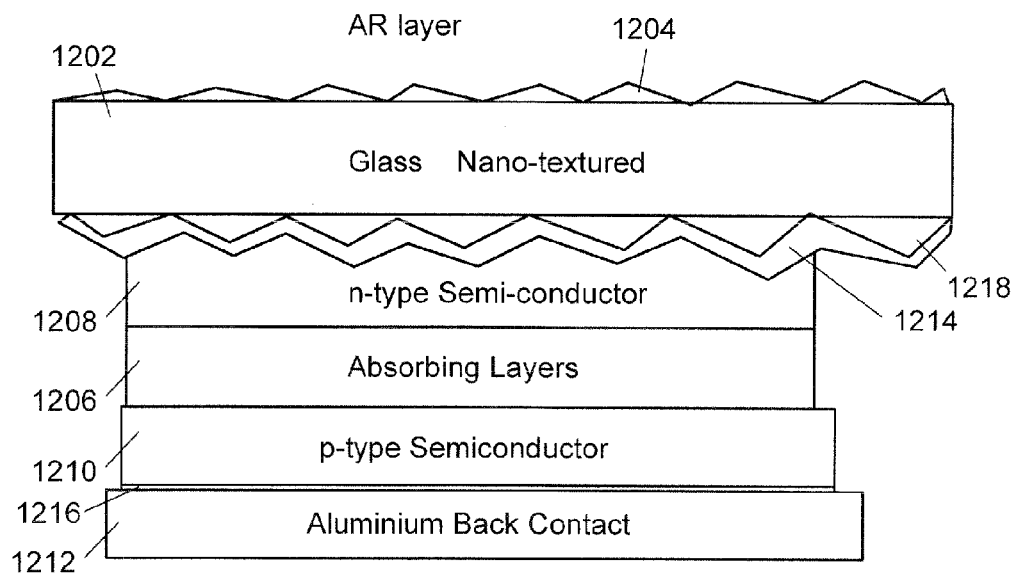
FIG. 12 is a cross-sectional schematic view of a solar photovoltaic device incorporating graphene-based layers according to certain example embodiments.

Alternatively, or in addition, doped graphene-based layers may be included therein so as to match with adjacent semiconductor layers. For instance, FIG. 12 is a cross-sectional schematic view of a solar photovoltaic device incorporating graphene-based layers according to certain example embodiments. In the FIG. 12 example embodiment, a glass substrate 1202 is provided. For example and without limitation, the glass substrate 1202 may be of any of the glasses described in any of U.S. patent application Ser. Nos. 11/049,292 and/or 11/122,218, the disclosures of which are hereby incorporated herein by reference. The glass substrate optionally may be nano-textured, e.g., to increase the efficiency of the solar cell. An anti-reflective (AR) coating 1204 may be provided on an exterior surface of the glass substrate 1202, e.g., to increase transmission. The anti-reflective coating 1204 may be a single-layer anti-reflective (SLAR) coating (e.g., a silicon oxide anti-reflective coating) or a multi-layer anti-reflective (MLAR) coating. Such AR coatings may be provided using any suitable technique.

One or more absorbing layers 1206 may be provided on the glass substrate 1202 opposite the AR coating 1204, e.g., in the case of a back electrode device such as that shown in the FIG. 12 example embodiment. The absorbing layers 1206 may be sandwiched between first and second semi-conductors. In the FIG. 12 example embodiment, absorbing layers 1206 are sandwiched between n-type semiconductor layer 1208 (closer to the glass substrate 1202) and p-type semiconductor 1210 (farther from the glass substrate 1202). A back contact 1212 (e.g., of aluminum or other suitable material) also may be provided. Rather than providing ITO or other conductive material(s) between the semiconductor 1208 and the glass substrate 1202 and/or between the semiconductor 1210 and the back contact 1212, first and second graphene-based layers 1214 and 1216 may be provided. The graphene-based layers 1214 and 1216 may be doped so as to match the adjacent semiconductor layers 1208 and 1210, respectively. Thus, in the FIG. 12 example embodiment, graphene-based layer 1214 may be doped with n-type dopants and graphene-based layer 1216 may be doped with p-type dopants.

Because it is difficult to directly texture graphene, an optional layer 1218 may be provided between the glass substrate 1202 and the first graphene-based layer 1214. However, because graphene is very flexible, it generally will conform to the surface on which it is placed. Accordingly, it is possible to texture the optional layer 1218 so that the texture of that layer may be "transferred" or otherwise reflected in the generally conformal graphene-based layer 1214. In this regard, the optional textured layer 1218 may comprise zinc-doped tin oxide (ZTO). It is noted that one or both of semiconductors 1208 and 1210 may be replaced with polymeric conductive materials in certain example embodiments.

Because graphene is essentially transparent in the near and mid-IR ranges implies that the most penetrating long wavelength radiation may penetrate and generate carriers deep into the i-layer of both single and tandem junction solar cells. This implies that the need to texture back contacts may not be needed with graphene-based layers, as the efficiency will already be increased by as much as several percentage points.

Screen-printing, evaporation, and sintering technologies and CdCl2 treatment at high temperatures are currently used in CdS/CdTe solar cell heterojunctions. These cells have high fill factors (FF>0.8). However, series resistance Rs is an efficiency limiting artifact. In Rs, there is a distributed part from sheet resistance of the CdS layer and a discrete component associated with the CdTe and graphite based contact on top of it. The use of one or more graphene-based layers may help reduce both contributions to Rs, while preserving good heterojunction properties. By including graphene in such a solar structure for both front and back contact arrangements, a substantial efficiency boost may be achieved.

It will be appreciated that certain example embodiments may involve single junction solar cells, whereas certain example embodiments may involve tandem solar cells. Certain example embodiments may be CdS, CdTe, CIS/CIGS, a-Si, and/or other types of solar cells.

Figure 13:
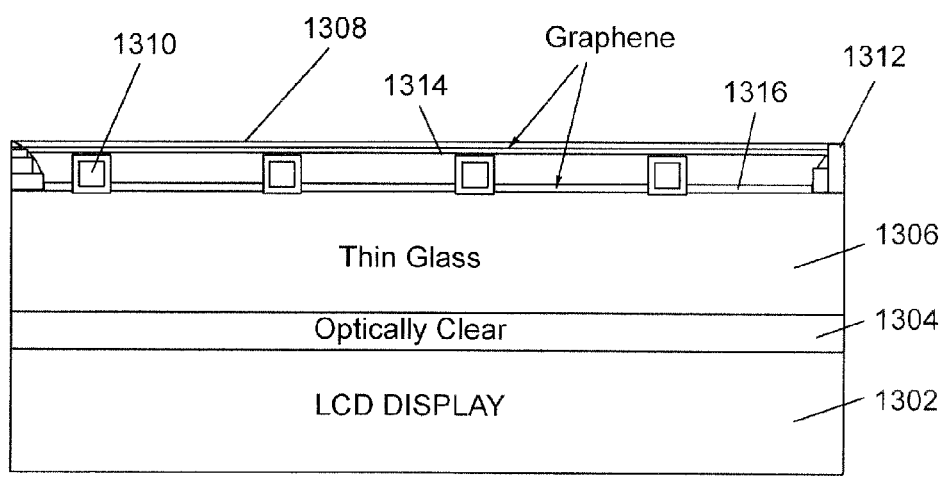
FIG. 13 is a cross-sectional schematic view of a touch screen incorporating graphene-based layers according to certain example embodiments.

Another example embodiment that may incorporate one or more graphene-based layers is a touch panel display. For instance, the touch panel display may be a capacitive or resistive touch panel display including ITO or other conductive layers. See, for example, U.S. Pat. Nos. 7,436,393; 7,372, 510; 7,215,331; 6,204,897; 6,177,918; and 5,650,597, and application Ser. No. 12/292,406, the disclosures of which are hereby incorporated herein by reference. The ITO and/or other conductive layers may be replaced in such touch panels may be replaced with graphene-based layers. For example, FIG. 13 is a cross-sectional schematic view of a touch screen incorporating graphene-based layers according to certain example embodiments. FIG. 13 includes an underlying display 1302, which may, in certain example embodiments, be an LCD, plasma, or other flat panel display. An optically clear adhesive 1304 couples the display 1302 to a thin glass sheet 1306. A deformable PET foil 1308 is provided as the top-most layer in the FIG. 13 example embodiment. The PET foil 1308 is spaced apart from the upper surface of the thin glass substrate 1306 by virtual of a plurality of pillar spacers 1310 and edge seals 1312. First and second graphene-based layers 1314 and 1316 may be provided on the surface of the PET foil 1308 closer to the display 1302 and to the thin glass substrate 1306 on the surface facing the PET foil 1308, respectively. One or both graphene-based layers 1314 and 1316 may be patterned, e.g., by ion beam and/or laser etching. It is noted that the graphene-based layer on the PET foil may be transferred from its growth location to the intermediate product using the PET foil itself. In other words, the PET foil may be used instead of a photoresist or other material when lifting off the graphene and/or moving it.

A sheet resistance of less than about 500 ohms/square for the graphene-based layers is acceptable in embodiments similar to those shown in FIG. 13, and a sheet resistance of less than about 300 ohms/square is advantageous for the graphene-based layers.

It will be appreciated that the ITO typically found in display 1302 may be replaced with one or more graphene-based layers. For example, when display 1302 is an LCD display, graphene-based layers may be provided as a common electrode on the color filter substrate and/or as patterned electrodes on the so-called TFT substrate. Of course, graphene-based layers, doped or undoped, also may be used in connection with the design and fabrication of the individual TFTs. Similar arrangements also may be provided in connection with plasma and/or other plat panel displays.

Figure 14:
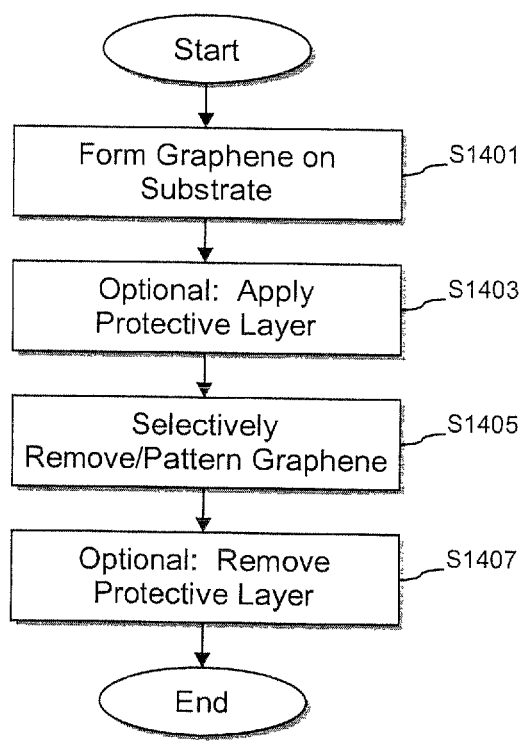
FIG. 14 is a flowchart illustrating an example technique for forming a conductive data/bus line in accordance with certain example embodiments.

Graphene-based layers also may be used to create conductive data/bus lines, bus bars, antennas, and/or the like. Such structures may be formed on/applied to glass substrates, silicon wafers, etc. FIG. 14 is a flowchart illustrating an example technique for forming a conductive data/bus line in accordance with certain example embodiments. In step S1401, a graphene-based layer is formed on an appropriate substrate. In an optional step, step S1403, a protective layer may be provided over the graphene-based layer. In step S1405, the graphene-based layer is selectively removed or patterned. This removal or patterning may be accomplished by laser etching. In such cases, the need for a protective layer may be reduced, provided that the resolution of the laser is fine enough. Alternatively or in addition, etching may be performed via exposure to an ion beam/plasma treatment. Also, as explained above, H* may be used, e.g., in connection with a hot filament. When an ion beam/plasma treatment is used for etching, a protective layer may be desirable. For example, a photoresist material may be used to protect the graphene areas of interest. Such a photoresist may be applied, e.g., by spin coating or the like in step S1403. In such cases, in another optional step, S1407, the optional protective layer is removed. Exposure to UV radiation may be used with appropriate photoresists, for example. In one or more steps not shown, the conductive graphene-based pattern may be transferred to an intermediate or final product if it was not already formed thereon, e.g., using any appropriate technique (such as, for example, those described above).

Although certain example embodiments have been described as etching away or removing graphene-based layers, certain example embodiments may simply change the conductivity of the graphene-based layer. In such cases, some or all of the graphene may not be removed. However, because the conductivity has been suitably altered, only the appropriately patterned areas may be conductive.

Figure 15:
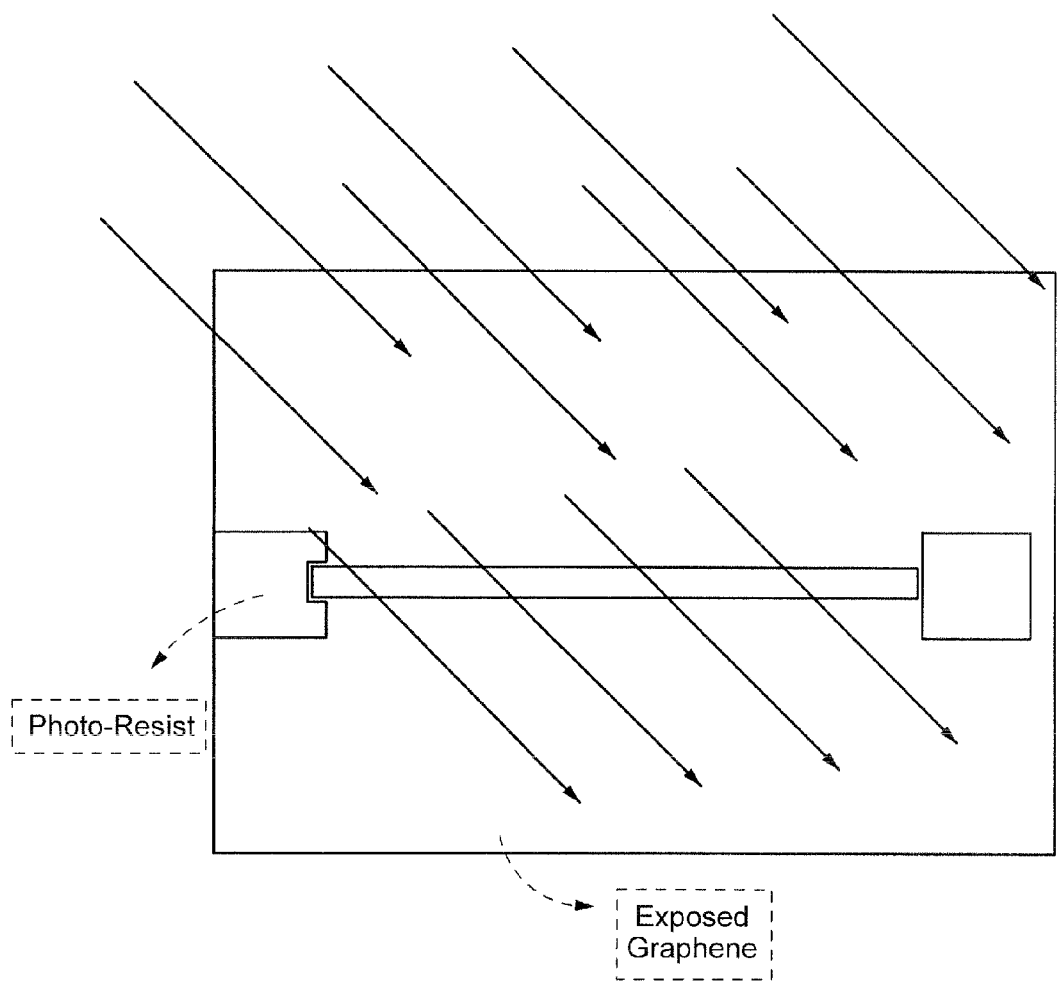
FIG. 15 is a schematic view of a technique for forming a conductive data/bus line in accordance with certain example embodiments.

FIG. 15 is a schematic view of a technique for forming a conductive data/bus line in accordance with certain example embodiments. As shown in FIG. 15, the conductivity of the graphene is selectively changed by virtue of exposure to an ion beam. A photoresist is applied in a suitable pattern, e.g., so as to protect desired portions of the graphene-based layer, whereas the other portions of the graphene-based layer remain exposed to the ion beam/plasma.

Mobility data is shown in the table below after various samples have been deposited and etched.

| Etched Samples | Passes | Thickness (Å) | Rho (Ωcm) | Conductivty (1/Ωcm) | Mobility μ (cm$^2$/Vs) |
| --- | --- | --- | --- | --- | --- |
| A | 25 | 8 | 1.03E−04 | 970000 | 120,000 |
| B | 20 | 6 | 5.24E−03 | 1010000 | 143000 |
| C | 10 | 6 | 5.94E−02 | 1600000 | 150000 |
| D | 5 | 6 | 1.48E−02 | 1500000 | 160000 |

It will be appreciated that patterning the graphene in this and/or other ways may be advantageous for a number of reasons. For example, the layer will be largely transparent. Thus, it is possible to provide "seamless" antennas where the pattern cannot be seen. A similar result may be provided in connection with bus bars that may be incorporated into vehicle windows (e.g., for defrosting, antenna usage, powering components, etc.), flat panel (e.g., LCD, plasma, and/or other) display devices, skylights, refrigerator/freezer doors/windows, etc. This may also advantageously reduce the need for black frits often found in such products. Additionally, graphene-based layers may be used in place of ITO in electrochromic devices.

Although certain example applications/devices have been described herein, as shown above, it is possible to use graphene-based conductive layers in place of or in addition to other transparent conductive coatings (TCCs), such as ITO, zinc oxide, etc.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A doped graphene thin film structure including a graphene thin film and a metal catalyst thin film, the doped graphene thin film structure comprising:

the doped graphene thin film directly or indirectly on the metal catalyst thin film having a substantially single-orientation large-grain crystal structure, wherein the graphene thin film is 1-10 atomic layers thick, and wherein the doped graphene thin film has a sheet resistance less than 150 ohms/square.

2. The doped graphene thin film structure of claim 1, wherein the doped graphene thin film includes n-type dopants.

3. The doped graphene thin film structure of claim 1, wherein the doped graphene thin film includes p-type dopants.

4. The doped graphene thin film structure of claim 1, wherein the doped graphene thin film is doped with any one or more of: nitrogen, boron, phosphorous, fluorine, lithium, potassium, and sulfur.

5. The doped graphene thin film structure of claim 1, wherein the doped graphene thin film has a sheet resistance of 10-20 ohms/square.

* * * * *